United States Patent [19]

Pikulski

[11] Patent Number: 4,935,621
[45] Date of Patent: Jun. 19, 1990

[54] OPTICAL SWITCH WITH COLLIMATING LENSES, ANITFREEZE AND/OR INDEX MATCHING FLUID FOR CONTROL OF ELECTRICAL EQUIPMENT

[76] Inventor: Joseph L. Pikulski, 153 Kevin St., Thousand Oaks, Calif. 91360

[21] Appl. No.: 319,995

[22] Filed: Mar. 7, 1989

Related U.S. Application Data

[63] Continuation of Ser. No. 114,871, Oct. 30, 1987, abandoned, which is a continuation of Ser. No. 713,236, Mar. 18, 1985, abandoned.

[51] Int. Cl.⁵ .............................................. H01J 40/14
[52] U.S. Cl. .................................... 250/229; 250/221; 250/577
[58] Field of Search ............ 250/229, 221, 227, 231 P, 250/577, 561; 340/619; 341/31

[56] References Cited

U.S. PATENT DOCUMENTS

| | | | |
|---|---|---|---|
| 3,526,775 | 9/1970 | Friedrich et al. | 250/221 |
| 3,906,222 | 9/1975 | Astier et al. | 250/229 |
| 4,021,119 | 5/1977 | Stauffer | 250/561 |
| 4,156,149 | 5/1979 | Vaccari | 250/577 |
| 4,534,651 | 8/1985 | Minikane | 250/227 |
| 4,607,160 | 8/1986 | Sakakino | 250/229 |

*Primary Examiner*—Edward P. Westin
*Attorney, Agent, or Firm*—Allen A. Dicke, Jr.

[57] ABSTRACT

Optical sensor has divergent light from a source, preferably from a single optical fiber, and a lens which collimates the light into a broad beam. The broad beam is acted upon and passes to another lens which focuses the beam onto a single optical fiber for detection. The beam is acted upon by reflecting off of a surface when the surface is dry or dissipating when the surface is wet, or is acted on in other ways to interrupt the beam to provide a water presence signal or the like.

5 Claims, 3 Drawing Sheets

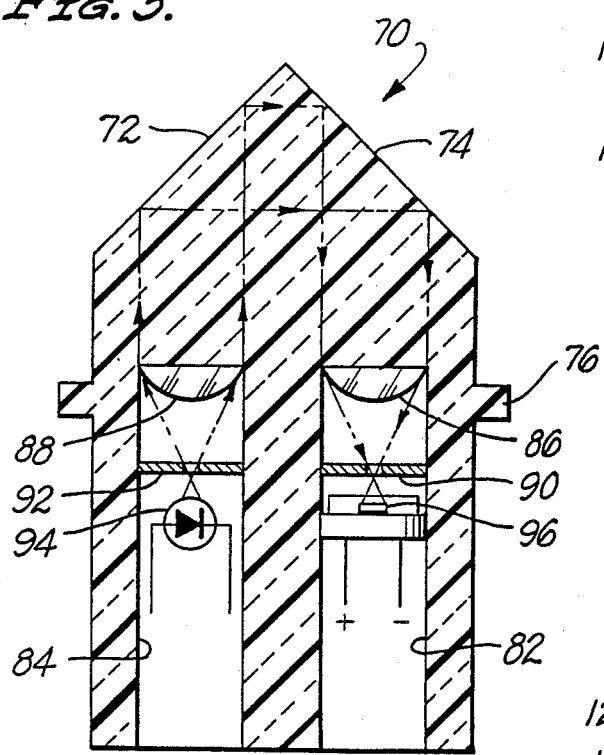
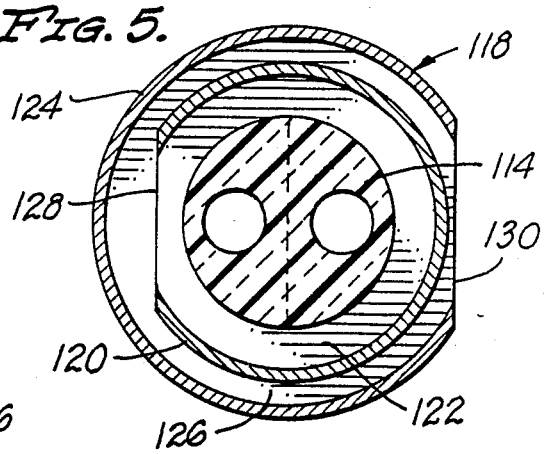
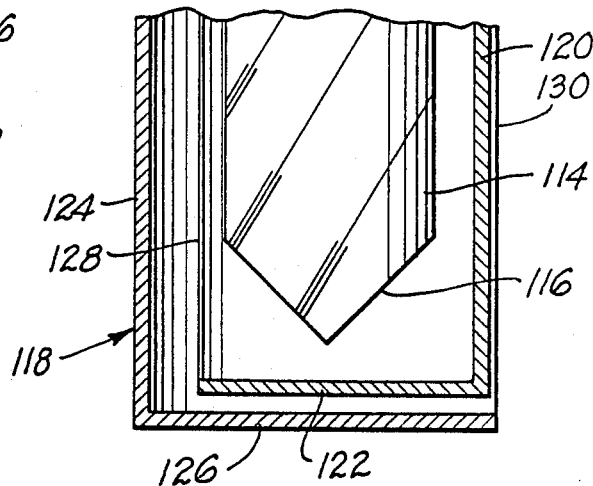
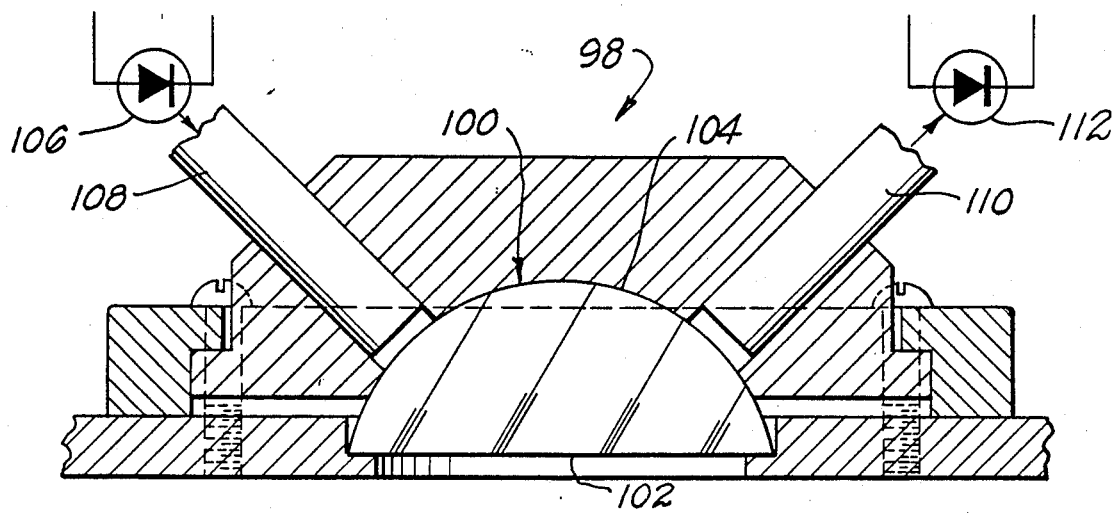

OPTICAL SWITCH WITH COLLIMATING LENSES, ANITFREEZE AND/OR INDEX MATCHING FLUID FOR CONTROL OF ELECTRICAL EQUIPMENT

CROSS REFERENCE

This application is a Rule 60 continuation of my prior application, Ser. No. 114,871, filed Oct. 30, 1987, for "Control System for Electric Motors", now abandoned, which in turn was a Rule 60 continuation of my earlier application Ser. No. 713,236, filed Mar. 18, 1985, for "Control System for Electric Motors", now abandoned, the entire disclosure of which is incorporated herein by this reference.

FIELD OF THE INVENTION

This invention is directed to a control system for electric motors, and particularly a control system wherein the electric motors are employed in connection with a body of water such as a pool or a spa and wherein the control system separates the electrical hazard from the user of the body of water, by optical connections.

BACKGROUND

Jetted bathtubs and spas have some similarities and some differences. The similarities include the fact that they are each an opened-topped vessel of warm water. A water pump pumps water from the vessel and reinjects it into the vessel through jets to cause turbulence. Quite often there is an air pump which injects water into the pumped water stream before the jet. Many modern homes have jetted bathtubs or spas. These are equipped with mechanical timers which serve as the on-off switch. These timers are mounted on a wall on the opposite side of the room from the tub, or away from the spa to avoid shock hazard. By rotating the timer switch to the on position, the pump will start, even if there is no water in the system. If the pump is left running under these conditions, the seal bearing surfaces will overheat, causing seal damage and subsequent leakage. Thus, the user must fill enough water in the vessel to supply the needs of the pump.

Another inconvenience of the mechanical timer switch system is that when the user is in the tub, the timer will eventually go off and the pump will stop. To restart the jets, the user must get out of the tub and rotate the timer switch back to the on position and then the user gets back into the tub. The purpose of the timer is twofold. In the first case it prevents the pump from running too long unattended without water, and thus may turn off the pump sufficiently soon to prevent damage to its seal. In the other case, without such a timer the user fills sufficient water into the tub, but leaves the pump on and running unattended for hours, when the user forgets that he turned it on or when the user gets out after use of the tub and forgets to turn it off. In this case, the timer turns off the pump to prevent unnecessary pump operation.

The significant differences between the spa and the jetted bathtub are two. First, the spa is outdoors and it uses the same water for a long period of time. On the other hand, the jetted bathtub is indoors and the water is drained after each user. The fact that the jetted bathtub is drained causes it to be of smaller volume and this smaller volume permits it to be placed indoors. As far as control systems are concerned, the jetted bathtub has more need for the detection of water flow through the pump, but both the spa and jetted bathtubs have similar problems.

Therefore, there is need for a control system to control the electric motors and other electrical equipment of a spa or jetted bathtub, whereby the motors are safely controlled, but are conveniently controlled by the user. Such a system should also include safety features for this system.

SUMMARY

In order to aid in the understanding of this invention it can be stated in essentially summary form that it is directed to a sensor system for the control of the electric motor driving a pump in a jetted water-containing vessel wherein the system optically senses the presence of water at the pump, has an optical switch accessible to the user of the vessel and has a control system including a timer which employs signals from the optical sensors and the timer to control the pump motor.

It is thus an object and advantage of this invention to provide a control system for the electric motor-driven pump in a spa or jetted bathtub or other similar vessel wherein the user is isolated from the electric power by means of optical devices so that his safety is assured, and the pump is fully controlled.

It is a further object and advantage of this invention to provide optical liquid sensors which reliably detect the presence of water in a bathing vessel so that a pump associated therewith can be properly controlled.

It is another object and advantage of this invention to provide a manually operable optical switch which switches by changes in the optical path so that electricity need not be brought into the region of the switch to eliminate electric shock hazards for the user of the switch.

It is a further object and advantage of this invention to provide a complete control system, incorporating optical water sensors and optical switches for vessels such as spas and jetted bathtubs whereby the electric motor driving these circulation pumps is properly controlled for the safety of the pump and the safety of the user.

Other objects and advantages of this invention will become apparent from the study of the following portion of this specification, the claims and the attached drawings.

BRIEF DESCRIPTION OF THE DRAWINGS

FIG. 3 is central section through a second preferred embodiment of an optical water presence sensor for use with this invention.

FIG. 4 is a longitudinal section through a third preferred embodiment of an optical water presence sensor in accordance with this invention.

FIG. 5 is an end view of a baffle for use with the optical water presence sensor.

FIG. 6 is a longitudinal section therethrough, showing a sensor in side elevation.

DESCRIPTION OF THE PREFERRED EMBODIMENTS

Figure 1:
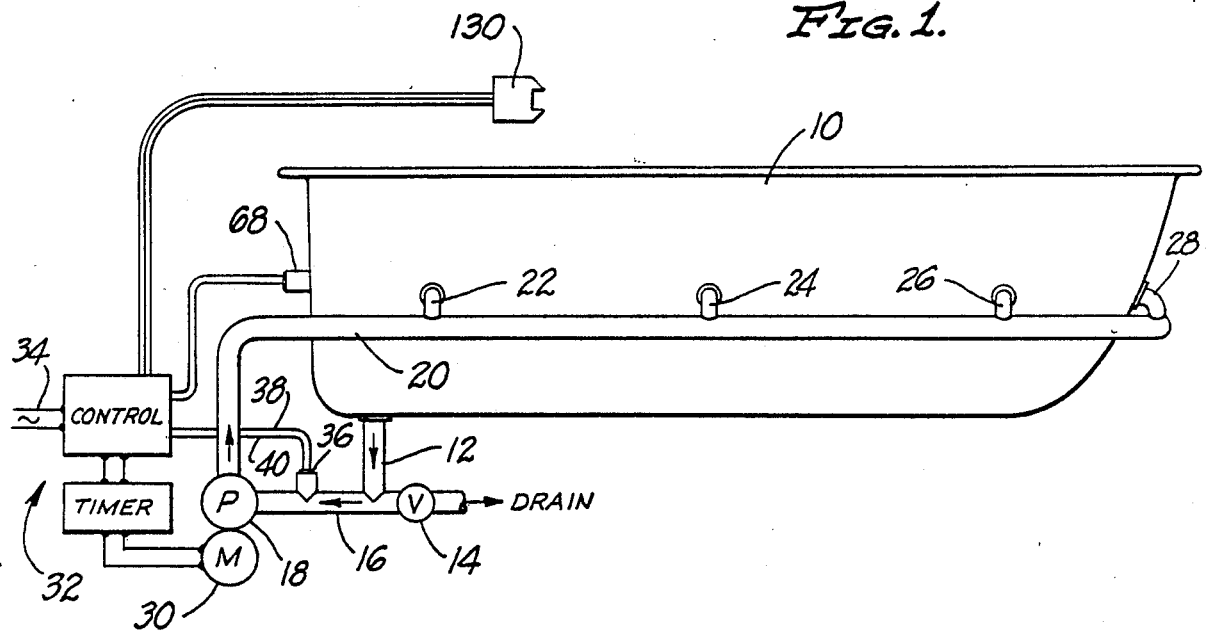
FIG. 1 is a schematic side elevational view of a jetted bathtub having the control system for the electric motor driving the circulation pump, in accordance with its invention.

As discussed above, the needs for a spa and a jetted bathtub are substantially the same. In order to describe the manner in which the control system of this invention is associated with such vessels, FIG. 1 illustrates the use of the control system with jetted bathtub 10. The jetted bathtub is of general bathtub shape, with sides and bottom together with an open top. The attachments to the sides and bottom are such that the tub can be subtantially filled with water and thereafter drained. In addition to the conventional features of the bathtub, the bathtub 10 is fitted with jets. The bottom drain 12 is connected through drain valve 14 to a suitable place to dispose of the bathtub water. In normal use, drain valve 14 is closed and is only open when the tub is to be emptied and the water drained away. The bottom drain 12 is also connected to pump suction line 16 which is connected to the suction port of pump 18. The pump discharges water at a pressure above atmospheric into manifold 20 which supplies water under pressure to a plurality of water jet nozzles, several of which are indicated at 22, 24, 26 and 28. These water jet nozzles direct the water into the tub at a significant velocity to cause turbulence in the water in the bathtub. It is this turbulence which is advantageous to the user. While only a water pump 18 is indicated, sometimes spas and other such vessels also incorporate an air pump. In that case, the air is usually injected into manifold 20 so that the jets into the vessel discharge both water and air. When an air pump is also included, it is controlled in parallel to the pump 18.

Motor 30 is energized from control system 32 which receives its power from electric line 34. In controlling a jetted bathtub, it is desirable to permit the pump to run only when there is sufficient water for the pump. In addition, the user should be able to turn the pump on from a convenient location and a timer should be incorporated to automatically turn off the pump after a predetermined time to prevent unnecessary running of the system. In order to safely accomplish the sensing of the presence of water, and sensing the user's desire to start the system, in order to separate the water containing components from the electrical equipment, optical signals are employed.

Figure 2:
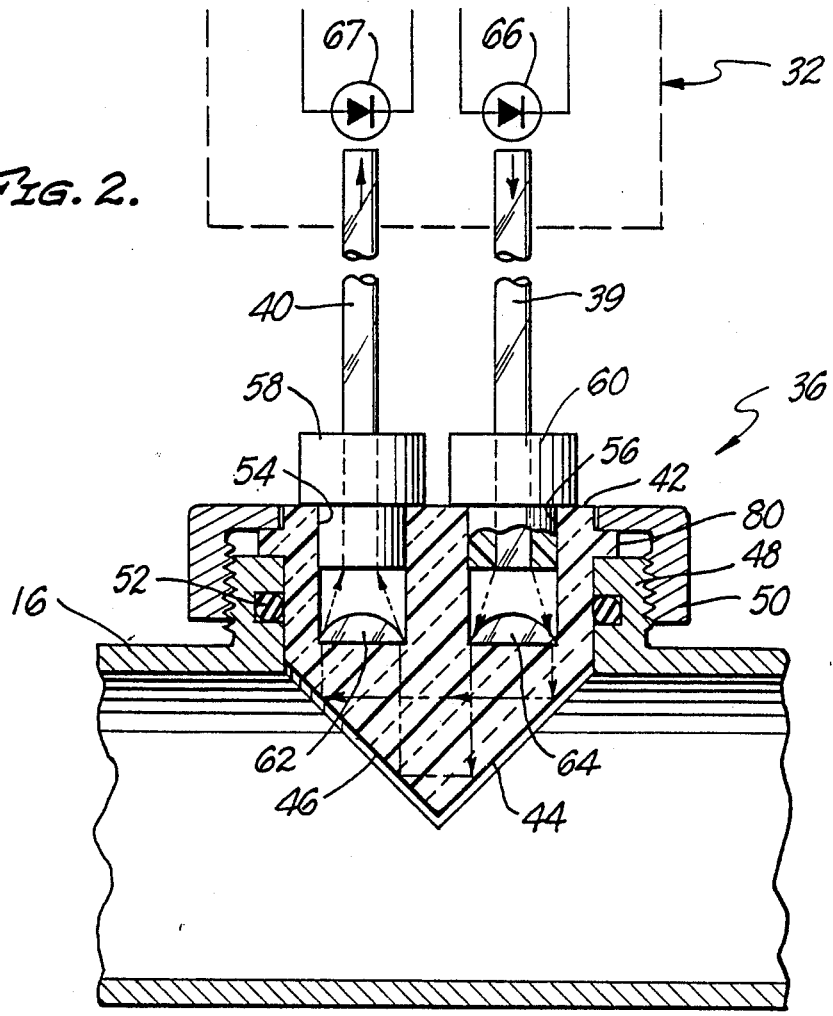
FIG. 2 is a section through a first preferred embodiment of an optical water presence sensor for use with the system.
Figure 7:
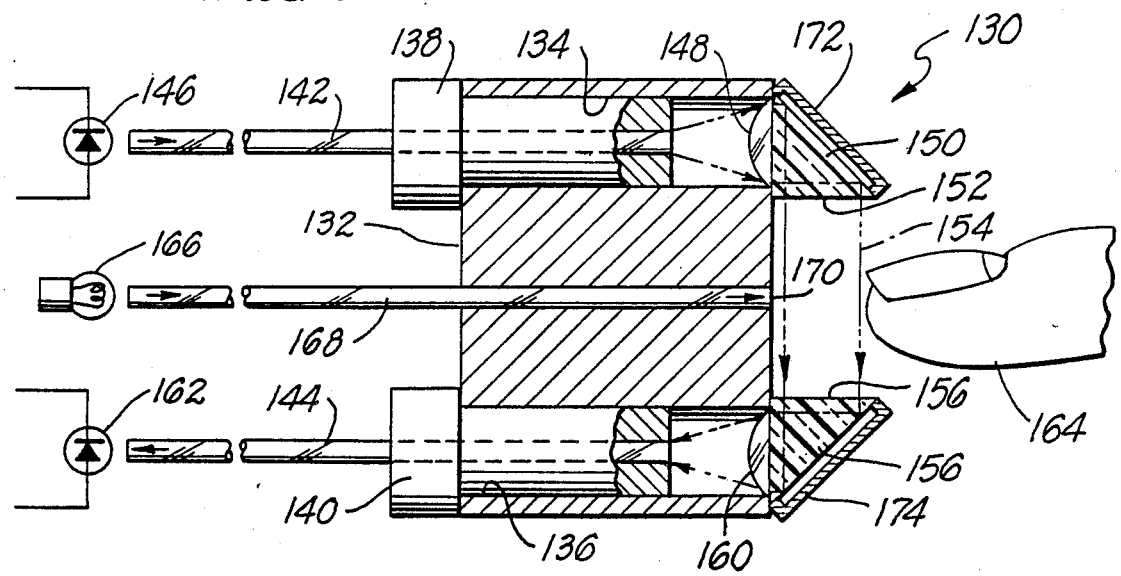
FIG. 7 is a longitudinal section through a first preferred embodiment of an optical switch for use with the control system of this invention.

As is seen in FIGS. 1 and 2, liquid sensor 36 is inserted in the upper side of pump suction 16 to indicate to the control system 32 the presence of water. In the water sensor 36, fiber optic elements 38 and 40 conduct signals between the control system 32 and the sensor. The fiber optic elements 38 and 40, and others discussed in this application are preferably coated single strand fibers for multimode transmission of light. Body 42 of sensor 36 is an optical element which is substantially transmissive to the light of interest and has forward prism faces 44 and 46. A suitable means as provided for securing the body with respect to pump suction line 16. In the example shown, a threaded hollow boss 48 on the pipe receives the body 42. A nut 50 clamps against a flange on the body 42 to secure the body in position. 0 ring seal 52 prevents leakage. The interior of the body is provided with cavities 54 and 56. These cavities respectively receive end flanges 58 and 60 secured at the ends of fibers 40 and 38. The cavities have space beyond the ends of the flanges and fibers and within this space is positioned a lens. Plano-convex lenses 62 and 64 are respectively positioned in the bottoms of the cavities with the planar surfaces of the lenses in contact with the planar surfaces in the bottoms of the cavities. An optical matching adhesive is preferably employed. Alternatively, the lenses are molded as with the rest of the sensor.

A light source is provided at the far end of fiber 38. In the presently preferred embodiment, the light source is a light-emitting diode 66 positioned in the housing of control system 32. The light-emitting diode is coupled to the optical fiber and when illuminated sends light down the fiber to sensor 36. At the lower, as seen in FIG. 2, end of fiber 38, the light is divergent. The divergent light in the cavity strikes the convex surface of lens 64 which collimates the nowbroad beam. The collimated beam reflects on the interior prism face 44 when the exterior prism face exposed in suction line 16 is dry. The reflected beam then reflects off of the interior prism face 46 and is delivered to the planar face of lens 62. Lens 62 makes the beam convergent and directed to the open end of optical fiber 40. The light passes through the fiber and in control system 32 strikes diode detector 68. The circuit connected to detector 68 signals that the surfaces 44 and 46 are dry, so that control system 32 prevents the pump 18 from being turned on. When the tub is filled, the water fills pipes 12 and 16 When the water lies against the prism faces 44 and 46 the former total internal reflection is destroyed and the light, instead of reflecting in the prism, passes through the face 44 into the liquid. Thus, there is no return signal to detector 68 The absence of return signal indicates water in pump suction line 16 so that the pump may be operated. Thus, the water sensor 36 detects the presence of water. In the absence of water against the faces 44 and 46 the prism has total internal reflection. In the presence of water, the total internal reflection is destroyed and the light beam is dissipated in the liquid. In this way, the difference in state is detected by detector 68.

A second water sensor 68, see FIG. 1, can be installed in the tub at a level below, at or above the tub overflow level. The water sensor 68 can be identical to the water sensor described with respect to FIG. 2, or may be of the type described below with respect to FIG. 3. The water level sensor 68 is an optional addition to signal a full tub or to prevent tub overflow. This sensor is preferably located at the point near the overflow level of the tub. When it is at the overflow level, sensor 68 can shut off the filling of the tub so that it may be used with each filling. When the sensor is positioned just above overflow level it senses when the water inflow rate is greater than the outflow rate through the overflow, to prevent overflow over the top edge of the tub. When this above-overflow level is sensed, the control system 32 can turn off the inflowing water or send an audible alarm. If the pump 18 is then running, it can shut down the pump. Liquid level sensor 68 is not a necessary part of the system, but it is an additional optional safety feature.

FIG. 3 shows a second preferred embodiment of a water sensor, generally indicated at 70. This water sensor can be alternatively employed in the place of water sensor 36 or water sensor 68. It comprises a prism having faces 72 and 74. The prism body at 78 is externally configured the same as prism body 42, including flange 76 which corresponds to flange 80 on prism body 42. Thus, water sensor 70 can be inserted into the same boss and sealed with respect to a water pipe or tub wall in the same manner as sensor 36. Thus, it is physically interchangeable with the sensor 36.

Sensor 70 has cavities 82 and 84 within the prism body. At the flat bottom of these cavities are plano-convex lenses 86 and 88. The flat side of these lenses is toward the prism and above the lenses and the cavities are irises 90 and 92. These irises are beam-cleaning irises to eliminate spurious, off-axis light. They accept only light on the optical axis and reflect off-axis light so that light trigger levels may be set and maintained at a constant level. Light source 94 is positioned within cavity 84 and adjacent iris plate. The on-axis light passing through the iris is divergent and strikes the convex surface of lens 88. The lens is in optical contact with the prism, as by matching fluid, and collimates the light. The collimated beam strikes the interior prism face 72, and when the face is clean and dry there is total internal reflection so that the beam strikes the inside of prism face 74. If prism face 74 is dry, there is total internal reflection and the beam passes into lens 86. Lens 86 focuses the beam through the iris in iris plate 90. That beam strikes detector 96 when a signal is received. When the prism faces are wet with water, the total internal reflection within the prism is destroyed and the beam passes into the water. There is little reflected signal which continues on the beam path to detector 96, and thus detector 96 indicates the presence of water. Both the light source 94 and detector 96 are electrically connected to control system 32. This avoids the use of optical fibers, but places the electrical components close to the water. However, the power lines to the light source and the signal from the detector can be at very low voltage so they do not produce a hazard to the user.

FIG. 4 illustrates a third preferred embodiment of the water sensor of this invention. The water sensor is generally indicated at 98. The body 100 of the water sensor is in the form of a flat-sided hemisphere having a flat side 102 and a hemispherically convex side 104. The body 100 is made of an optical material, the same as the bodies of the previously described water sensors. Light-emitting diode 106 delivers light to a fiber optic element 108 which delivers a divergent beam to the convex surface of the detector body 100. The convex surface collimates the beam to produce a beam of substantially parallel rays within the body. This beam reflects off of the interior surface of flat side 102 when the surface is clean and dry. The reflected beam is focused as it passes out of the convex surface of the detector body and is focused onto the input end of fiber optic element 110, or is focused without fibers through an iris from a source or to a detector, as shown in FIG. 3. At its output end, fiber optical element 110 delivers the light to light sensor 112. The angle at which the beam strikes the surface 102 is such that there is total internal reflection when the surface 102 is dry but when the surface is wet with water, the beam passes out into the water. In such a case there is little reflection and little light delivered to detector 112. The detector body 100 can be configured and mounted so that it installs in the side of a vessel or water pipe, in a similar manner to the mounting shown in FIG. 2.

When any one of the sensors 36, 70 or 98 is placed where ambient light can strike the sensing surface, there is chance that the ambient light will actuate the sensor, even when total internal reflection from the light source is absent. For this reason, the baffle structure shown in FIGS. 5 and 6 can be employed over the faces of any one of the above-described sensors when the sensor is placed in the position of water sensor 68. The water sensor 114 illustrated in FIGS. 5 and 6 has one or more active faces 116 which are exposed to the presence of water, when the water is in the vessel or pipeline. In order to prevent ambient light from striking the active face, the baffle 118 is employed. Baffle 118 comprises inner tube 120 which is in the form of a right cylindrical tube having a closed-end cap 122. Tube 120 embraces water sensor 114. Outer tube 124 is a cylindrical tube of larger diameter and having a closed-end cap 126. End cap 126 is spaced from end cap 122 as indicated in FIG. 6. Both of these tubes are concentric with the detector 114 and are carried by the mounting of the detector in any convenient way, such as by flanges with clamp with respect to a boss associated with the mounting of the detector prism. Inner tube 120 has an open side 128, and opposite to that, the outer tube 124 has an open side 130. The inner wall of outer tube 124 and both the inner and outer walls of inner tube 120 are preferably treated so as to be light-absorbent to minimize ambient light which reaches the detector prism. In this way, the detector prism has protected against ambient light.

In a jetted bathtub or spa control system, it is necessary to turn on the pump, preferably at the demand of the user, providing there is sufficient water in the system, and turn on the pump for only a limited time. Preferably the system starts the pump and the timer at the same time so that there is requirement for only one user-actuated sensor, positioned conveniently to the user. In accordance with this invention, the user-operated sensor is positioned adjacent to the user when he is in the jetted tub and the sensor is connected to the control system by means of optical fibers. The user is protected against hazardous electrical potentials at the tub.

FIGS. 7, 8, 9 and 10 illustrate embodiments of the user-operated sensor, which can conveniently be called a switch because it switches the optical pathway in such a manner that the control system can sense the demand of the user that the system be actuated. Switch 130 illustrated in FIG. 7 has a structural body 132 which carries the optical components. Cavities 134 and 136, respectively, carry caps 138 and 140 which serve as the end terminations of optical fibers 142 and 144. Fiber 142 is illuminated by light-emitting diode 146 in the control box 32. The light from the output end of the fiber is divergent and strikes the convex face of plano convex lens 148. This lens collimates the now broad beam of light into prism 150 which projects the broad beam 154 out of prism face 152. When the beam is unobstructed, the beam strikes prism face 156 on prism 158 which reflects the beam to the planar face of plano convex lens 160. That lens focuses the beam onto the open end of fiber 144 which in turn delivers the light to photo diode detector 162 and the electronics of the control system in box 32. When the beam 154 is interrupted, such as by the insertion of finger 164 between the prisms, the light level at detector 162 goes down. This decreased signal is interpreted in the electronics as switch actuation such as a demand for pump operation and starting of the timer.

Despite the demand by the user by the actuation of switch 130 that the pump be started, the logic of the control system prevents starting of the pump unless there is sufficient water as sensed at the pump suction. Therefore, the pump will not start if the water is low. To assure the user that this is not a failure of switch 130 and its associated logic, lamp 166 is provided as a signal lamp which signals the presence of adequate water so that upon demand, the user can start the pump. The light of signal lamp 166 is conducted by optical fiber 168 to terminate at the face of body 132 between prisms 150 and 158, at the point where the beam can be interrupted. Thus the fiber end 170 serves both as a signal that the switch can be actuated to start the pump and timer, and as a target for location of the switch, should the surroundings be dark. Covers 172 and 174 are provided over the hypotenuse surfaces of the prisms in order to keep them moisture free or liquid free for maximum total internal reflection.

Figure 8:
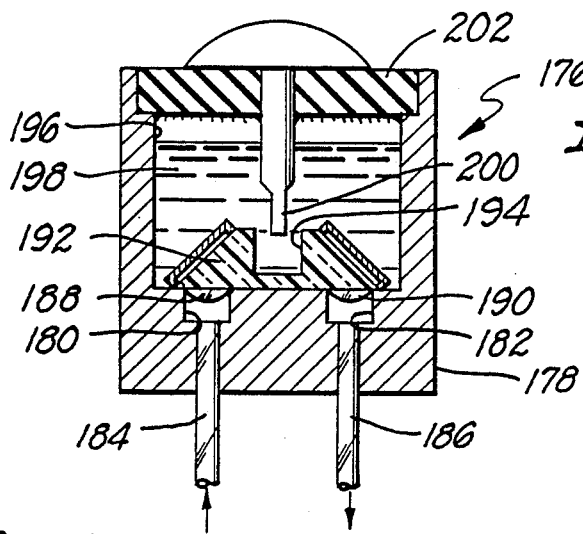
FIG. 8 is a longitudinal section through a second preferred embodiment thereof.

Optical switch 176 illustrated in FIG. 8 is the second preferred embodiment of an optical switch of this invention. Body 178 has cavities 180 and 182 in which terminate optical fibers 184 and 186. At the top of the cavities are lenses 188 and 190 which are convex toward the fibers and flat toward the double prism structure 192. As an alternative, the lenses may be formed as a part of the double prism structure. Double prism 192 has a notch 194 therein in the optical beam path. Body 178 has space 196 in which the prism is located. The space 196 is almost filled with liquid 198. Plunger 200 is mounted on resilient cover 202 in such a way that when the cover is manually depressed, plunger 200 enters into the light path across the notch in the double prism, to cut off light continuity. The switch 176 is liquid filled to prevent condensation therein, which otherwise might occur on the optical surfaces of switch 130 because of the high humidity conditions in which such a switch is used. Such condensation would cause inadvertent operation. In addition, the liquid-filled switch 176 can be filled with a low temperature freezing liquid so that it can be employed in places which have very low temperatures.

Figure 9:
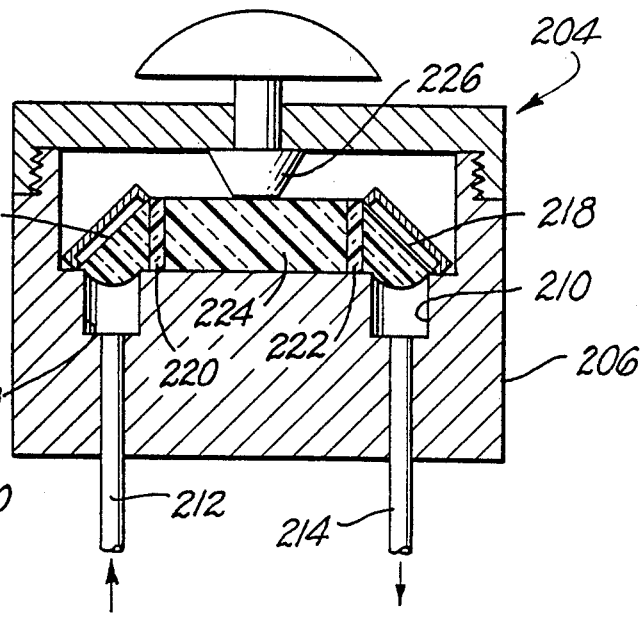
FIG. 9 is a longitudinal section through a third preferred embodiment of an optical switch for use in the system of this invention.

Optical switch 204 as shown in FIG. 9 is the third preferred embodiment of an optical switch for use in connection with the system of this invention. Optical switch 204 includes a body 206 which has cavities 208 and 210. The input and output optical fibers 212 and 214 terminate in these cavities.. At the top of these cavities are prisms 216 and 218 which respectively have a convex collimating lens and a convex focusing lens incorporated therein. Prism 216 directs a broad beam toward prism 218. Between these prisms are located first and second polarizers 220 and 222, and between the polarizers is an optoelastomeric member 224. Plunger 226 is positioned to act against the member 224. Member 224 has the property that when it is not strained, polarized light is not rotated, but when is strained the polarized light passing therethrough is rotated. Thus, when the polarizers 220 and 222 are placed crossed to each other and member 224 is not strained, the no light passes through so that no light signal is detected at the lower end of optical fiber 214. When plunger 226 is depressed, polarized light passing through member 224 is rotated so that the amount of light passing through polarizer 222 is increased proportionally to applied force reduced and the increased light is detected as a signal of switch operation. It should also be noted that the polarizers 220 and 222 can be oriented with respect to each other so that maximum light through the optical circuit occurs when the member 224 is strained. In that case, the maximum light signal out of fiber 214 corresponds to switch actuation.

Figure 10:
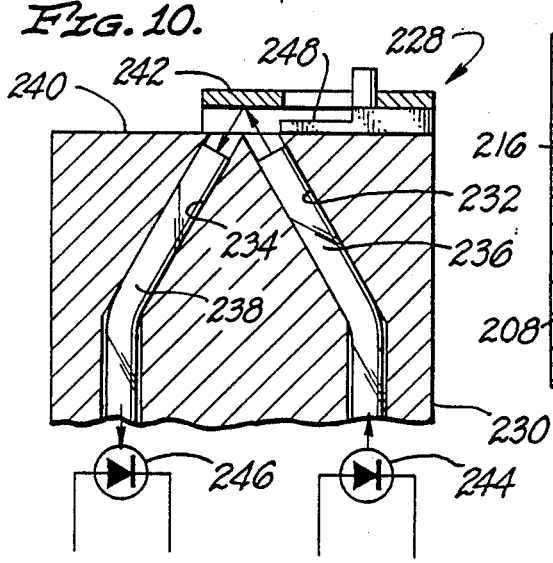
FIG. 10 is a longitudinal section through a fourth preferred embodiment of an optical switch for use in the system of this invention.

FIG. 10 shows a fourth preferred embodiment of a user-operated switch for signaling the control system of this invention. The optical switch is generally indicated at 228. Switch 228 has a body 230 which has cavities 232 and 234 therein. Input and output optical fibers 236 and 238 are positioned within these cavities and terminate adjacent face 240 of the body. As is seen in FIG. 10, the cavities and optical fibers converge toward each other at the face. Reflector 242 is positioned beyond face 240 in such a position that light projecting out of the end of optical fiber 236 is reflected on the reflector back to the output optical fiber 238. When this optical path is open, light source 244 delivers enough illumination through the path to provide a signal to detector 246. Switch slide 248 is manually operable to slide on face 240. In the position shown in FIG. 10 it is away from the optical path, but it can be manually slid to the left where it obstructs the optical path. The underside of switch slide 248 is diffuse or absorbent so that the optical path is interrupted. The signal out of detector 246 goes down sufficiently to indicate slide operation. A structural alternative to the moving slide 248 is provision for tilting or moving mirror 242.

Several of the sensors and switches include beam-expanding lenses in association with the prisms in which there is total internal reflection. The surfaces of the prism which are in contact with the liquid are very important for proper operation. This is because a liquid droplet may hang up on the face of the prism and cause diffusion of the collimated light. The beam-expanding and collimating optics are chosen so that the beam is expanded to a size which is greater than the average size of such a liquid droplet. The remaining prism face area operates in the total internal reflection mode. The system is set so that as long as any portion of the surface is acting in the total internal reflection mode, the liquid sensor of FIGS. 2, 3 and 4 signal the absence of liquid. The focusing lens at the output of the second prism returns the energy to the output optical fiber.

It will be appreciated that as an aid to limiting the optical fibers to reasonable lengths that the emitters and detectors, with their associated amplifier circuitry, may not be in the central control box but may be closer to the sensor switch. The satellite electronics would be connected to the central control logic. The electrical isolation is still provided by the optical fibers Inside each satellite control station are located the necessary source and detector along is the necessary amplification and processing logic. The wires from the main control logic to the satellite modules provide the low voltage necessary to power the electronics and logic and to return a control logic signal back to the main control logic. By using such a satellite system only one optimized switch electronics and sensor electronics is required because only short runs of optical fiber are required.

This invention has been described in its presently contemplated best mode and it is clear that it is susceptible to numerous modifications, modes and embodiments within the ability of those skilled in the art and without the exercise of the inventive faculty. Accordingly, the scope of this invention is defined by the scope of the following claims.

I claim:

1. A switch comprising:
   first and second spaced and facing prisms each having a hypotenuse surface, first and second covers respectively attached to said first and second prisms to closely cover said hypotenuse surfaces without contacting said surfaces, the space between said first and second prisms being enclosed and containing a low freezing temperature substantially optically transparent liquid;
   a divergent light source associated with said first prism for directing light along a path toward said first prism;
   a first convex lens along said first path shaped and positioned to collimate a broad beam from said divergent light source for illuminating said first prism so that light reflects off of the inside of said hypotenuse surface, said second prism being oriented with respect to said first prism so that said second prism can receive light from said hypotenuse surface of said first prism, said second prism at least under some circumstances reflecting light off of the inside of said hypotenuse surface of said second prism;
   a second convex lens positioned along a second path to receive the collimated broad beam reflected by said second prism, said second convex lens being shaped and positioned to focus the collimated broad beam; and
   an optical detector positioned with respect to said second lens to receive light reflected from said hypotenuse surface of said second prism and focused by said second lens so as to form a complete optical circuit so that when the space between said prisms is unobstructed said detector receives light and when the space is obstructed said detector receives no light from said source.

2. The switch of claim 1 wherein there is a first optical fiber between said light source and said first prism and there is a second optical fiber between said second prism and said detector so that electrical signals are remote from said sensor.

3. A switch comprising:
   first and second spaced and facing prisms each having a hypotenuse surface, first and second covers respectively attached to said first and second prisms to closely cover said hypotenuse surfaces without contacting said surfaces, the space between said first and second prisms being enclosed and containing a low freezing temperature substantially optically transparent liquid;
   a plunger connected to obstruct the passage of light between said first and second prism so that actuation of said plunger causes optical switch actuation;
   a divergent light source associated with said first prism for directing light along a path toward said first prism;
   a first convex lens along said first path shaped and positioned to collimate a broad beam from said divergent light source for illuminating said first prism so that light reflects off of the inside of said hypotenuse surface, said second prism being oriented with respect to said first prism so that said second prism can receive light from said hypotenuse surface of said first prism, said second prism at least under some circumstances reflecting light off of the inside of said hypotenuse surface of said second prism;
   a second convex lens positioned along a second path to receive the collimated broad beam reflected by said second prism, said second convex lens being shaped and positioned to focus the collimated broad beam; and
   an optical detector positioned with respect to said second lens to receive light reflected from said hypotenuse surface of said second prism and focused by said second lens so as to form a complete optical circuit so that when the space between said prisms is unobstructed said detector receives light and when the space is obstructed said detector receives no light from said source.

4. An optical switch comprising:
   an electrically-powered light emitter wherein the light emitted from said emitter is related to the current through said emitter, a first optical fiber associated wtih said emitter to transmit light produced by said emitter;
   an optical path;
   a light detector having an electrical output upon receipt of light thereon, a second optical fiber associated with said detector to transmit light to said detector, said optical path extending from said emitter to said detector;
   optical means between said first and second fibers for controlling the amount of light passing from said first fiber to said second fiber in accordance with external effects, said optical means including first and second prisms each having a hypotenuse surface and having space therebetween on the optical path between said prisms;
   a housing enclosing the space between said prisms, an anti-freeze substantially optically transparent liquid in said housing between said prisms;
   first and second covers respectively attached to said first and second prisms to closely cover said hypotenuse surfaces without contacting said surfaces;
   first and second lenses respectively between said first optical fiber and said first prism to collimate divergent light from said first fiber into a substantially collimated broad beam which has an optical path from said first prism through said second prism and said second fiber to focus the collimated broad beam into said second fiber; and
   means associated with said prisms for controlling the light passing out of said second prism into said second optical fiber.

5. An optical switch comprising:
   an electrically-powered light emitter wherein the light emitted from said emitter is related to the current through said emitter, a first optical fiber associated with said emitter to transmit light produced by said emitter;
   an optical path;
   a light detector having an electrical output upon receipt of light thereon, a second optical fiber associated with said detector to transmit light to said detector, said optical path extending from said emitter to said detector, said light path being obstructible so that said detector detects obstructions in said light path, said fibers having ends, space between said ends;
   optical means between said ends of said first and second fibers for controlling the amount of light passing from said first fiber to said second fiber in accordance with external effects;

a housing enclosing the space between said fibers, an anti-freeze substantially optically transparent liquid in said housing between said fibers; and means associated with said fibers for controlling the light into said second optical fiber.

* * * * *